(12) United States Patent
Mao et al.

(10) Patent No.: US 9,231,515 B2
(45) Date of Patent: Jan. 5, 2016

(54) METHOD OF MONITORING PERFORMANCE OF AN ELECTRIC MOTOR

(71) Applicant: GM GLOBAL TECHNOLOGY OPERATIONS LLC, Detroit, MI (US)

(72) Inventors: Xiaofeng Mao, Novi, MI (US); Lei Hao, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 394 days.

(21) Appl. No.: 13/767,917

(22) Filed: Feb. 15, 2013

(65) Prior Publication Data

US 2014/0236501 A1 Aug. 21, 2014

(51) Int. Cl.
| | |
|---|---|
| *G01R 21/00* | (2006.01) |
| *H02P 29/02* | (2006.01) |
| *G01R 31/34* | (2006.01) |
| *B60L 15/20* | (2006.01) |
| *B60W 10/08* | (2006.01) |
| *G01R 21/06* | (2006.01) |

(52) U.S. Cl.
CPC .......... *H02P 29/021* (2013.01); *G01R 31/343* (2013.01); *B60L 15/20* (2013.01); *B60W 10/08* (2013.01); *G01R 21/00* (2013.01); *G01R 21/06* (2013.01); *Y02T 10/7275* (2013.01)

(58) Field of Classification Search
USPC .......................................................... 702/60
See application file for complete search history.

(56) References Cited

U.S. PATENT DOCUMENTS

| | | | | |
|---|---|---|---|---|
| 5,492,273 | A * | 2/1996 | Shah ........................... | 236/44 A |
| 6,364,806 | B1 * | 4/2002 | Spaniel ............................. | 477/3 |
| 2005/0266957 | A1 * | 12/2005 | Kamijo et al. ..................... | 477/3 |
| 2011/0118924 | A1 * | 5/2011 | Nasu et al. ....................... | 701/22 |

FOREIGN PATENT DOCUMENTS

WO     WO 2013184143 A1 * 12/2013

\* cited by examiner

*Primary Examiner* — Paul D Lee
(74) *Attorney, Agent, or Firm* — Quinn Law Group, PLLC

(57) ABSTRACT

A method of monitoring performance of an electric motor includes calculating an actual input power and an expected input power of the electric motor. A power difference between the actual input power and the expected input power is recursively calculated over at least one period of an electrical cycle of the electric motor to determine a variance in the power difference during the at least one period of the electrical cycle. The variance in the power difference is compared to a threshold value to determine if the variance in the power difference is greater than the threshold value or less than the threshold value. The control module may signal that the electric motor is not operating within allowable operating parameters when the variance in the power difference is less than the threshold value.

13 Claims, 1 Drawing Sheet

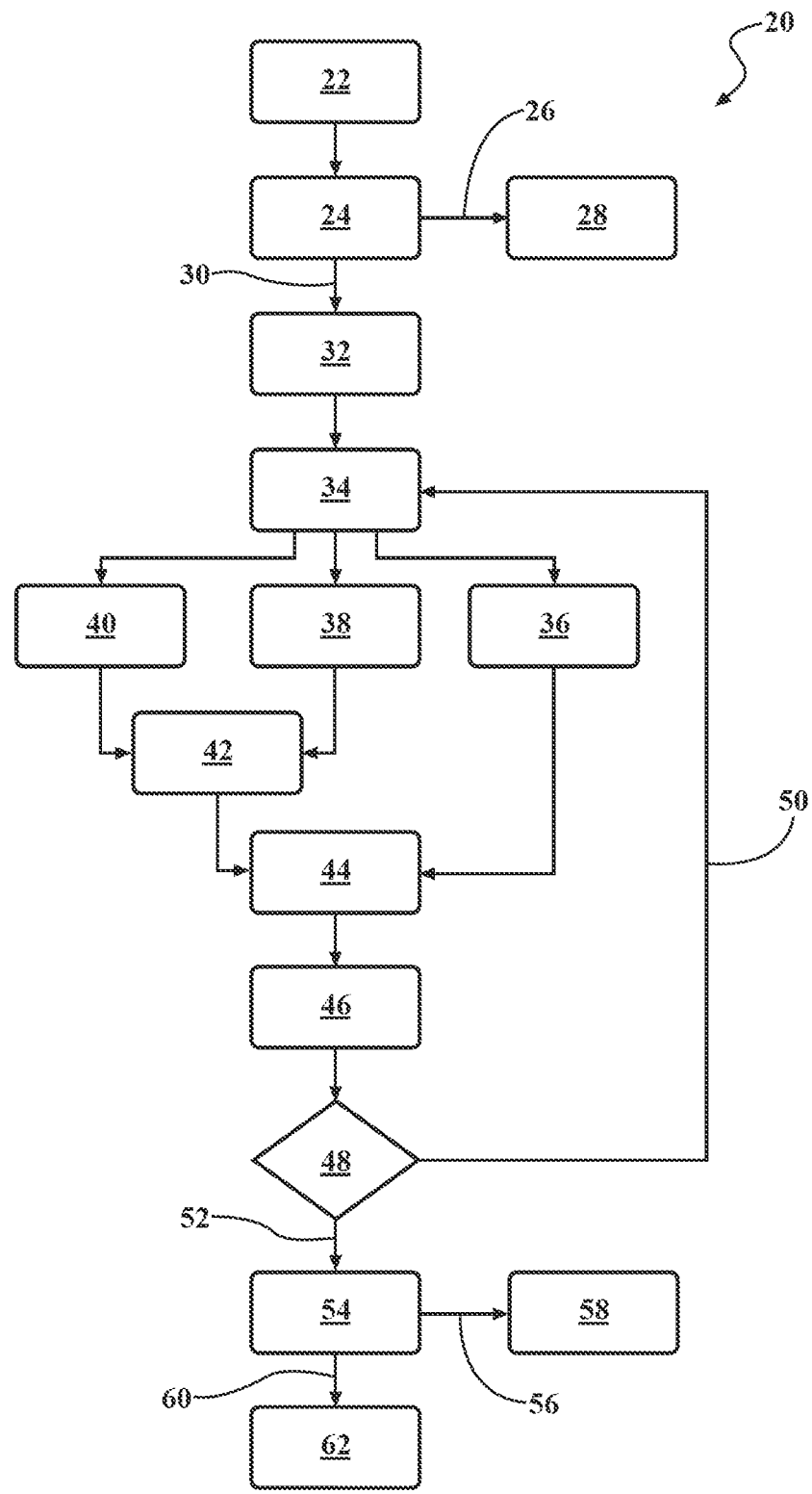

METHOD OF MONITORING PERFORMANCE OF AN ELECTRIC MOTOR

TECHNICAL FIELD

The invention generally relates to a method of monitoring performance of an electric motor, and more specifically to a method of detecting a short in a stator winding of the electric motor.

BACKGROUND

Electric motors include a rotor and a stator. The stator includes a winding that reacts with the rotor to generate rotation of the rotor relative to the stator. If an electrical short occurs in the stator winding, both the efficiency of the electric motor and the power output of the electric motor decrease. It is therefore important to be able to detect a short in the stator winding in order to determine if the electric motor is working properly.

SUMMARY

A method of monitoring performance of an electric motor is provided. The method includes calculating an actual input power of the electric motor, with a control module, and calculating an expected input power, with the control module. A power difference between the actual input power and the expected input power is recursively calculated over at least one period of an electrical cycle of the electric motor. The power difference is recursively calculated to determine a variance in the power difference during the at least one period of the electrical cycle. The variance in the power difference is compared to a threshold value, with the control module, to determine if the variance in the power difference is greater than the threshold value or less than the threshold value. The control module may signal that the electric motor is not operating within allowable operating parameters when the variance in the power difference is less than the threshold value.

A method of detecting a short in a stator winding of an electric propulsion motor of a vehicle is also provided. The method includes providing a control module having an algorithm operable thereon capable of performing the following steps. The control module is operable to calculate an actual input power of the electric motor by multiplying a sensed voltage of the electric motor by a sensed current of the electric motor. An output power of the electric motor is calculated by multiplying a sensed output torque of the electric motor by a sensed rotational speed of the electric motor. An efficiency of the electric motor is calculated based on the sensed output torque of the electric motor, the sensed rotational speed of the electric motor, a sensed temperature of the electric motor, and the sensed voltage of the electric motor. An expected input power of the electric motor is calculated by dividing the calculated output power of the electric motor by the calculated efficiency of the electric motor. A power difference between the actual input power and the expected input power is recursively calculated over at least one period of an electrical cycle of the electric motor. The power difference is recursively calculated to determine a variance in the power difference during the at least one period of the electrical cycle. The variance in the power difference is compared to a threshold value. The control module may signal a possible electrical short in the stator winding of the electric motor when the variance in the power difference is less than the threshold value.

Accordingly, the control module compares the actual input power to the expected input power required to achieve the actual output power. If the expected input power, i.e., the amount of power that would be expected to generate the actual output power of the electric motor, varies from the actual input power by more than an allowable amount, then the control module may determine that the electric motor is not operating within allowable operating parameters, and may have an electrical short in the stator winding. However, if the expected input power is equal to or within an acceptable range of the actual input power, then the control module may determine that the electric motor is operating within allowable operating parameters, with no electrical shorts in the stator winding.

The above features and advantages and other features and advantages of the present invention are readily apparent from the following detailed description of the best modes for carrying out the invention when taken in connection with the accompanying drawings.

BRIEF DESCRIPTION OF THE DRAWINGS

The FIGURE is a flowchart showing a method of monitoring the performance of an electric motor.

DETAILED DESCRIPTION

Those having ordinary skill in the art will recognize that terms such as "above," "below," "upward," "downward," "top," "bottom," etc., are used descriptively for the figures, and do not represent limitations on the scope of the invention, as defined by the appended claims. Furthermore, the invention may be described herein in terms of functional and/or logical block components and/or various processing steps. It should be realized that such block components may be realized by any number of hardware, software, and/or firmware components configured to perform the specified functions.

Referring to the FIGURE, wherein like numerals indicate like parts throughout the several views, a method of monitoring performance of an electric motor, such as detecting a short in a stator winding of an electric propulsion motor of a vehicle, is generally shown at 20 in the FIGURE.

The electric motor includes a rotor and a stator. The rotor may include magnets that magnetically react with a winding of the stator to generate rotation of the rotor relative to the stator as is known. A control module may be attached to the electric motor to control and monitor the operation of the electric motor.

The control module may include a computer and/or processor, and include all software, hardware, memory, algorithms, connections, sensors, etc., necessary to manage and control the operation of the electric motor. As such, the method of monitoring performance of the electric motor may be embodied as an algorithm or program operable on the control module. It should be appreciated that the control module may include any device capable of analyzing data from various sensors, comparing data, making the necessary decisions required to monitor the operation of the electric motor, and executing the required tasks necessary to monitor the operation of the electric motor.

Referring to the FIGURE, the method 20 includes providing the control module, generally indicated by box 22, that is operable to control and monitor the operation of the electric motor. As noted above, the control module includes all software, hardware, memory, algorithms, connections, sensors, etc. necessary to manage and control and monitor the operation of the electric motor. The control module is operable to perform the various tasks of the method described below.

The control module may run one or more diagnostics tests, generally indicated by box 24, on other systems and/or components prior to running the diagnostic test on the electric motor described below. For example, the control module may run diagnostic tests on a battery, an inverter, or a gear set to determine if the other systems and/or components are operating properly. If the control module determines that one or more of the other systems and/or components is not operating properly or is faulty, generally indicated at 26, then the control module may signal such a fault, generally indicated by box 28. If however, the control module determines that all of the other components and/or systems are operating properly, generally indicated at 30, then the control module may begin the diagnostic test of the electric motor, generally indicated by box 32.

Once the control module begins the diagnostic test of the electric motor, data related to the various operating parameters of the electric motor is sensed, generally indicated by box 34, such as by a plurality of various sensors. The control module is configured to receive the data from various sensors. The sensors provide data related to an output torque of the electric motor, a temperature of the electric motor, a rotational speed of the electric motor, a voltage of the electric motor, and a current of the electric motor. The control module uses the data related to the various operating parameters of the electric motor to monitor the operation of the electric motor and determine if the electric motor is operating properly.

An actual input power of the electric motor is calculated, and generally indicated by box 36. An output power of the electric motor is also calculated, and generally indicated by box 38. The actual input power is the power applied to the electric motor. The actual input power may be calculated in any suitable manner, including but not limited to, multiplying the sensed voltage of the electric motor by the sensed current of the electric motor. The output power is the amount of power produced and output from the electric motor, which may be applied, for example, to rotate a drive wheel of a vehicle. The output power of the electric motor may be calculated in any suitable manner, including but not limited to, multiplying the sensed output torque of the electric motor by the sensed rotational speed of the electric motor.

An efficiency of the electric motor is also calculated, generally indicated by box 40. The efficiency of the electric motor is dependent upon the sensed output torque of the electric motor, the sensed rotational speed of the electric motor, the sensed temperature of the electric motor, and the sensed voltage of the electric motor. The efficiency of the electric motor may be calculated in any suitable manner. For example, the control module may input the various factors into an equation to calculate the efficiency of the electric motor under the sensed conditions. Alternatively, the control module may reference a look-up table to obtain the efficiency of the electric motor at the sensed operating conditions. The look-up table may be stored in the memory of the control module.

An expected input power of the electric motor is also calculated, generally indicated by box 42. The expected input power of the electric motor is the amount of power required to generate the output power at the calculated efficiency when the electric motor is operating properly. The expected input power may be calculated in any suitable manner, such as but not limited to, dividing the calculated output power of the electric motor by the calculated efficiency of the electric motor. When the expected input torque varies from the actual input torque, the control module may assume that the electric motor is not functioning optimally. Accordingly, a power difference between the actual input power and expected input power may be used to infer the state of health of the electric motor.

The power difference is calculated, generally indicated by box 44, by subtracting the expected input power from the actual input power. The power difference is recursively calculated several times over one or multiple periods of an electrical cycle of the electric motor. The value of the power difference is calculated several times within each period of the electrical cycle to determine the variance in the power difference during the period of the electrical cycle, generally indicated by box 46. The variance of the power difference is the amount of change between each calculated value of the power difference during the period of the electrical signal. Accordingly, if each calculated value of the power difference includes an identical value, then the variance in the power difference would equal zero. However, if each calculated value of the power difference includes a different value, then the variance is the mathematical difference between the largest calculated value of the power difference and the smallest calculated value of the power difference. The recursively calculated power difference is tracked over the at least one period of the electrical cycle of the electric motor, and the variance in the calculated power difference is continuously updated to identify the maximum calculated value of the variance in the power difference during the at least one period of the electrical cycle.

The control module must determine if the one or more periods of the electrical cycle has completed, generally indicated by box 48. If the one or multiple periods of the electrical cycle have not completed, generally indicated at 50, then the control module continues to recursively calculate the power difference and update the value of the power difference in the memory of the control module. If the one or multiple periods of the electrical cycle are complete, generally indicated at 52, then the control module compares, generally indicated by box 54, the variance in the power difference to a threshold value to determine if the variance in the power difference is greater than the threshold value, or is less than the threshold value.

When the variance in the power difference is greater than the threshold value, generally indicated at 56, then the control module may signal that the electric motor is operating within allowable operating parameters, generally indicated by box 58. Alternatively, when the variance in the power difference is less than the threshold value, generally indicated at 60, then the control module may signal that the electric motor is not operating within allowable operating parameters, generally indicated by box 62.

The threshold value may include a number used to indicate proper functionality of the electric motor. For example, the variance in the power difference may be converted into a state of health percentage of the electric motor, and compared to a pre-defined percentage value. The pre-defined percentage value may include a value between the range of 5% and 30%.

The state of health percentage of the electric motor may be calculated by solving Equation 1)

$$SOH = \left(\frac{\text{Var}^{max} - \text{Var}}{\text{Var}^{max} - \text{Var}^{min}}\right) \times 100\% \qquad 1)$$

wherein SOH is equal to the state of health percentage of the electric motor, $\text{Var}^{max}$ is equal to the maximum allowable variance of the power difference, $\text{Var}^{min}$ is equal to the minimum variance of the power difference, and Var is the calculated variance of the power difference of the electric motor. The maximum allowable variance (Var$^{max}$) is the maximum variance in the power difference signal for the electric motor which has the lowest state of health that can be tolerated, i.e., the lower limit of the allowable operating parameters. The minimum variance of the power difference (Var$^{min}$) is the variance of the power difference when the electric motor is operating at 100% state of health, i.e., when the electric motor is functioning properly. The maximum allowable variance of the power difference, and the minimum variance of the power difference may be defined to include any suitable value appropriate for the specific type and/or style of the electric motor.

Accordingly, if the calculated state of health percentage is greater than the pre-defined percentage value, then the control module may determine that the electric motor is operating within allowable operating parameters, and that no short in the stator windings is identifiable. Alternatively, if the calculated state of health percentage is less than the pre-defined percentage value, then the control module may determine that the electric motor is not operating within allowable operating parameters, and that a short in the stator winding may exist. When the control module determines that the electric motor is not operating within the allowable operating parameters or that a short in the stator winding may exist, then the control module may generate a signal indicating an improperly functioning electric motor or a possible electrical short in the stator winding of the electric motor. The control module may signal in any suitable manner, such as by activating a warning light, generating a message, or storing a value in the memory of the control module to indicate that the electric motor is not operating within allowable operating parameters.

The detailed description and the drawings or figures are supportive and descriptive of the invention, but the scope of the invention is defined solely by the claims. While some of the best modes and other embodiments for carrying out the claimed invention have been described in detail, various alternative designs and embodiments exist for practicing the invention defined in the appended claims.

The invention claimed is:

1. A method of monitoring performance of an electric motor, the method comprising:
   sensing an output torque of the electric motor, a temperature of the electric motor, a rotational speed of the electric motor, a voltage of the electric motor and a current of the electric motor, with at least one sensor;
   communicating the sensed output torque of the electric motor, the sensed temperature of the electric motor, the rotational speed of the electric motor, the voltage of the electric motor and the current of the electric motor, to a control module;
   calculating an actual input power of the electric motor, with the control module;
   calculating an expected input power, with the control module;
   recursively calculating a power difference between the actual input power and the expected input power over at least one period of an electrical cycle of the electric motor, with the control module, to determine a variance in the power difference during the at least one period of the electrical cycle;
   comparing the variance in the power difference to a threshold value, with the control module, to determine if the variance in the power difference is greater than the threshold value or less than the threshold value;
   wherein comparing the variance in the power difference to the threshold value includes calculating a state of health percentage of the electric motor;
   wherein calculating the state of health percentage of the electric motor includes defining a maximum allowable variance of the power difference, and a minimum variance of the power difference;
   wherein calculating the state of health percentage of the electric motor includes solving the equation:

$$SOH = \left(\frac{\text{Var}^{max} - \text{Var}}{\text{Var}^{max} - \text{Var}^{min}}\right) \times 100\%$$

wherein SOH is equal to the state of health percentage of the electric motor, Var$^{max}$ is equal to the maximum allowable variance of the power difference, Var$^{min}$ is equal to the minimum variance of the power difference, and Var is the calculated variance of the power difference of the electric motor; and
   activating a signaling device to indicate that the electric motor is not operating within allowable operating parameters when the variance in the power difference is less than the threshold value.

2. A method as set forth in claim 1 wherein calculating the actual input power of the electric motor is further defined as multiplying the sensed voltage of the electric motor by the sensed current of the electric motor to obtain the actual input power.

3. A method as set forth in claim 1 further comprising calculating an efficiency of the electric motor for the sensed output torque of the electric motor, the sensed rotational speed of the electric motor, the sensed temperature of the electric motor, and the sensed voltage of the electric motor.

4. A method as set forth in claim 3 wherein calculating the efficiency of the electric motor is further defined as referencing a look-up table stored in a memory of the control module to obtain the efficiency of the electric motor at the sensed output torque of the electric motor, the sensed rotational speed of the electric motor, the sensed temperature of the electric motor, and the sensed voltage of the electric motor.

5. A method as set forth in claim 3 further comprising calculating the output power of the electric motor by multiplying the sensed output torque of the electric motor by the sensed rotational speed of the electric motor.

6. A method as set forth in claim 5 wherein calculating the expected input power is further defined as dividing the calculated output power of the electric motor by the calculated efficiency of the electric motor.

7. A method as set forth in claim 6 wherein calculating the power difference between the actual input power of the electric motor and the expected input power of the electric motor is further defined as subtracting the calculated expected input power from the calculated actual input power to obtain the power difference.

8. A method as set forth in claim 1 wherein tracking the recursively calculated power difference over the at least one period of the electrical cycle of the electric motor includes recursively updating the variance in the calculated power difference during the at least one period of the electrical cycle to identify the maximum calculated value of the variance in the power difference during the at least one period of the electrical cycle.

9. A method as set forth in claim 1 wherein comparing the variance in the power difference to a threshold value is further defined as comparing the state of health percentage to a pre-defined percentage value.

10. A method as set forth in claim 9 wherein the pre-defined percentage value is between the range of 5% and 30%.

11. A method as set forth in claim 1 wherein signaling that the electric motor is not operating within allowable operating parameters includes storing a value in a memory of the control module to indicate that the electric motor is not operating within allowable operating parameters.

12. A method as set forth in claim 1 further comprising signaling that the electric motor is operating within allowable operating parameters when the variance in the power difference is greater than the threshold value.

13. A method as set forth in claim 1 further comprising providing a control module having an algorithm operable thereon capable of:
- receiving data indicating the sensed output torque of the electric motor, the sensed temperature of the electric motor, the sensed rotational speed of the electric motor, the sensed voltage of the electric motor, and the sensed current of the electric motor;
- calculating the actual input power of the electric motor;
- calculating the output power of the electric motor;
- calculating the efficiency of the electric motor;
- calculating the expected input power of the electric motor;
- calculating the power difference between the actual input power and the expected input power;
- calculating the variance in the power difference;
- comparing the variance in the power difference to a threshold value; and
- signaling that the electric motor is not operating within allowable operating parameters when the variance in the power difference is less than the threshold value.

* * * * *